United States Patent [19]

Imai et al.

[11] Patent Number: 5,069,157
[45] Date of Patent: Dec. 3, 1991

[54] THIN FILM FORMING APPARATUS

[75] Inventors: Mizuho Imai; Mikio Sekiguchi; Nobuyasu Shiba; Hideyo Iida, all of Tokyo, Japan

[73] Assignee: Taiyo Yuden Co., Ltd., Tokyo, Japan

[21] Appl. No.: 573,235

[22] Filed: Aug. 24, 1990

[30] Foreign Application Priority Data

Aug. 31, 1989 [JP] Japan .................................. 1-224981

[51] Int. Cl.⁵ ........................... B05B 1/34; B05C 5/00
[52] U.S. Cl. .................................... 118/314; 118/324; 118/326
[58] Field of Search ................. 118/59, 314, 325, 326, 118/428, 324, 50; 239/124, 566, 589

[56] References Cited

U.S. PATENT DOCUMENTS 4,750,412 6/1988 Itou ...................................... 118/326
4,783,006 11/1988 Hayashi et al. ...................... 118/300

Primary Examiner—Michael Wityshyn
Assistant Examiner—Charles K. Friedman
Attorney, Agent, or Firm—Flynn, Thiel, Boutell & Tanis

[57] ABSTRACT

A thin film forming apparatus which forms a thin film over the film forming surface of a substrate by spraying a mist of a source solution produced by atomization over the film forming surface of the substrate heated to a given temperature. The substrate conveying direction is reversible, or a nozzle for spouting the mist into a film forming chamber and an exhaust duct are connected removably to a hearth forming the bottom wall of the film forming chamber and can be switched with one another. The film forming apparatus is capable of forming thin films of different laminate constructions.

5 Claims, 6 Drawing Sheets

THIN FILM FORMING APPARATUS

BACKGROUND OF THE INVENTION

1. Field of the Invention

The present invention relates to a thin film forming apparatus and, more specifically, to a thin film forming apparatus which forms a thin film over the surface of a substrate by spraying an atomized source solution over the surface of the heated substrate.

2. Description of the Prior Art

A conventional thin film forming apparatus of a spraying system sprays a source solution prepared beforehand over the surface of a substrate to form a thin film over the surface of the substrate. The thin film forming apparatus is provided with an atomizer for atomizing the previously prepared source solution, a nozzle disposed above the atomizer to spout the atomized source solution into a film forming chamber, and an exhaust duct connected to the film forming chamber. The atomizer comprises a mist box and a sprayer disposed in the mist box. Only a mist of comparatively small droplets of the source solution is spouted through the nozzle into the film forming chamber, and then the mist is exhausted from the film forming chamber through the exhaust duct.

Substrates arranged successively in a line are moved at a given speed from a preheating chamber through the film forming chamber to an exit. While being moved through the film forming chamber, the substrates are heated with a heater placed opposite to the backsides of the substrates. The mist of the source solution touches the surfaces of the heated substrates as the same move through the film forming chamber, a material contained in the solution reacts with oxygen contained in air or in the moisture of the source solution to form thin films of an oxide over the surfaces of the substrates. The substrates having their lower surfaces coated with the thin films are delivered from a substrate delivery chamber.

Since the proportion of liquid ingredient and gaseous ingredient contained in the mist of the source solution is liable to change while the mist spouted through the nozzle into the film forming chamber flows through the film forming chamber the exhaust duct, mists of different states are formed which deposit films of different characteristics on the substrate.

That is, the mist of the source solution as spouted into the film forming chamber is a perfect mist, namely, a mist consisting of liquid droplets, and hence a film deposited from such a perfect mist consists of crystals oriented to the plane (200) on a three-dimensional coordinate system, has a comparatively smooth surface, and has a comparatively high electrical resistance because the film contains impurities, such as Cl and F, excessively.

On the other hand, most droplets of the mist are vaporized in the vicinity of the exhaust duct and hence a film deposited from such a mist consists of crystals oriented to various planes including the plane (200), has a comparatively coarse surface, and has a comparatively low electrical resistance because the film contains only a small amount of impurities.

Although thin films of different characteristics are formed respectively at different positions in the film forming chamber, a film having the former characteristics and a film having the latter characteristics are formed successively over the surface of the substrate to form a thin film because the substrate is moved in one direction.

Some purposes require a thin film of a construction other than such a layer construction, however, the conventional thin film forming apparatus is unable to form a thin film meeting such a requirement.

Most portions of a thin film formed over the surface of a substrate is formed at a very high film forming rate in the vicinity of the spouting opening of the nozzle, at which the mist is spouted toward the surface of the substrate, and the film forming rate decreases sharply with the distance from the spouting opening of the nozzle. Therefore, the moving speed of the substrate must be comparatively low to form a thin film having a comparatively large thickness. However, reduction in the moving speed of the substrate entails the reduction of the productivity of the thin film forming apparatus.

SUMMARY OF THE INVENTION

Accordingly, it is an object of the present invention to provide a thin film forming apparatus capable of forming thin films respectively having different constructions.

To achieve the object of the invention, the present invention provides a thin film forming apparatus comprising an atomizer for atomizing a source solution for forming a thin film, a film forming chamber, a nozzle having a spouting opening into the film forming chamber at one end of the same to spout a mist produced by atomizing the source solution into the film forming chamber, substrate feed means for feeding substrates into the film forming chamber so that the respective film forming surfaces of the substrates form the ceiling of the film forming chamber, and heating means for heating the substrates, wherein the substrate conveying direction is reversible.

The object of the invention can be achieved also by a thin film forming apparatus comprising a hearth forming the bottom wall of a film forming chamber, a relocatable nozzle attached to the hearth, and relocatable exhaust ducts attached to the hearth.

It is effective to dispose two exhaust ducts respectively on opposite sides of at least one nozzle. The film forming chamber may be provided with a plurality of nozzles or a pair of nozzles may be disposed respectively on opposite sides of one exhaust duct.

The thin film forming apparatus in accordance with the present invention is capable of changing the relation between the respective positions of the nozzle and the exhaust duct and the substrate conveying direction by reversing the substrate conveying direction, changing the respective positions of the nozzle and the exhaust duct in the film forming chamber, or selectively using one of the two exhaust ducts to form a thin film of a desired construction consisting of component thin films respectively having different characteristics. Employment of a plurality of nozzles facilitates the forming of a thin film having a comparatively large thickness.

DESCRIPTION OF THE PREFERRED EMBODIMENTS

Preferred embodiments of the present invention will be described hereinafter with reference to the accompanying drawings.

Figure 1:
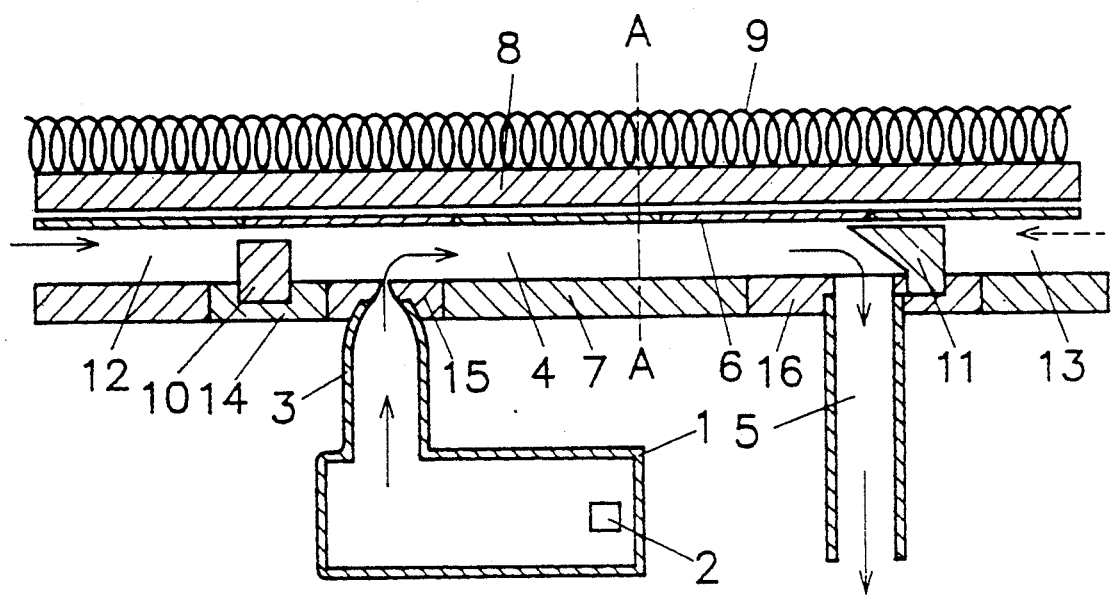
FIG. 1 is a fragmentary longitudinal sectional view of a thin film forming apparatus of a first embodiment according to the present invention.
Figure 2:
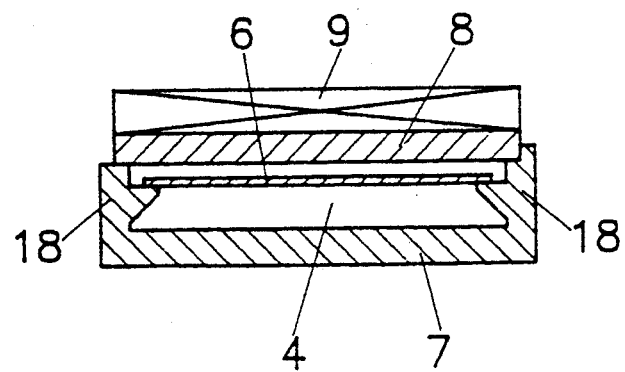
FIG. 2 is a sectional view taken on line A—A in FIG. 1.
Figure 3:
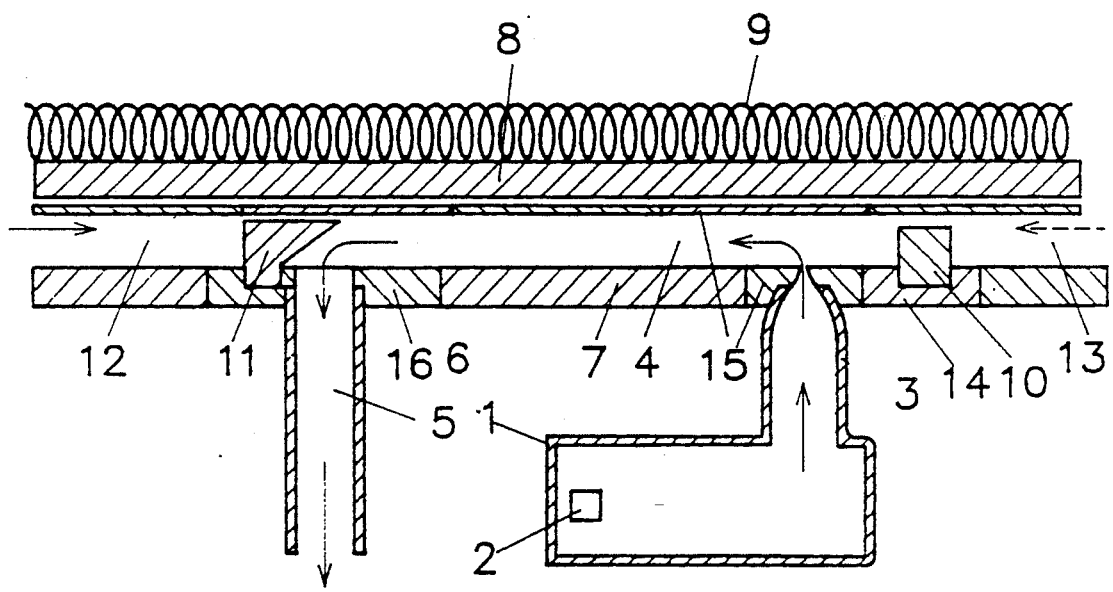
FIG. 3 is a fragmentary longitudinal sectional view of the thin film forming apparatus of FIG. 1, in which the disposition of a nozzle and an exhaust duct is reversed to that in FIG. 1.

Referring to FIGS. 1 to 3, a thin film forming apparatus in a first embodiment according to the present invention comprises an atomizer 1 for producing a mist of a source solution by atomization, a nozzle 3 placed upright on top of the atomizer 1 and having a spouting opening opening into a film forming chamber 4 at a position near one end, i.e., the left end as viewed in FIG. 1, of the film forming chamber 4, and an exhaust duct 5 connected to the film forming chamber 4 at a position near the other end of the film forming chamber 4. The mist of the source solution is spouted through the nozzle 3 into the film forming chamber 4. The mist spouted into the film forming chamber 4 flows through the film forming chamber 4 and is discharged through the exhaust duct 5 from the film forming chamber 4.

The film forming chamber 4 is separated from a preheating chamber 12 by a partition member 10. A mist guide 11 separates the film forming chamber 4 from a substrate delivery chamber 13 and guides the flow of the mist toward the exhaust duct 5.

As shown in FIG. 2, the film forming chamber 4 is a tunnel-shaped space having a bottom surface defined by a hearth 7, and side surfaces defined by side walls 18. Supporting ribs for supporting a substrate 6 at its opposite sides project inwardly respectively from the opposite inner surfaces of the side walls 18. The lower surface of the substrate 6 supported on the supporting ribs define the ceiling of the film forming chamber 4. Practically, a plurality of substrates 6 are arranged successively in a line and are moved at a given speed. A soaking plate 8 is disposed over the substrates 6 so as to extend from the preheating chamber 12 through the film forming chamber to the substrate delivery chamber 13. A heating element 9 is disposed over the soaking plate 8 to heat the substrates 6 to a given temperature.

The film forming apparatus is able to move the substrate 6 either from the left to the right or from the right to the left as viewed in FIGS. 1 and 3. When the film forming apparatus of FIG. 1 moves the substrate 6, for example, from the left to the right, the substrate 6 passes the nozzle 3 first, and then passes the exhaust duct. When the substrate 6 is moved from the right to the left, the substrate 6 passes the exhaust duct 5 first, and then passes the nozzle 3.

As shown in FIGS. 1 and 3, the hearth 7 forming the bottom wall of the film forming chamber 4 is provided with connection members 14, 15 and 16 respectively for connecting the partition member 10, the nozzle 3 and the exhaust duct 5 to the hearth 7. The connection members 14, 15 and 16 are fitted into corresponding openings formed in the hearth 7.

The respective positions of the connection members 14, 15 and 16 are interchanged to change the flowing direction of the mist within the film forming chamber 4 by changing the respective positions of the partition member 10, the nozzle 3, the exhaust duct 5 and the mist guide 11 relative to each other. In FIG. 1, since the partition member 10 and the nozzle 3 are disposed on the left-hand side of the film forming chamber 4, and the exhaust duct 5 and the mist guide 11 are disposed on the right-hand side of the film forming chamber 4, the mist flows from the left-hand side to the right-hand side of the film forming chamber 4. In FIG. 3, since the partition member 10 and the nozzle 3 are disposed on the right-hand side of the film forming chamber 4, and the exhaust duct 5 and the mist guide 11 are disposed on the left-hand side of the film forming chamber 4, the mist flows from the right-hand side of the film forming chamber 4 to the left-hand side of the film forming chamber 4. Thus, the relation between the substrate conveying direction and the flowing direction of the mist can be reversed without changing the substrate conveying direction.

Figure 4:
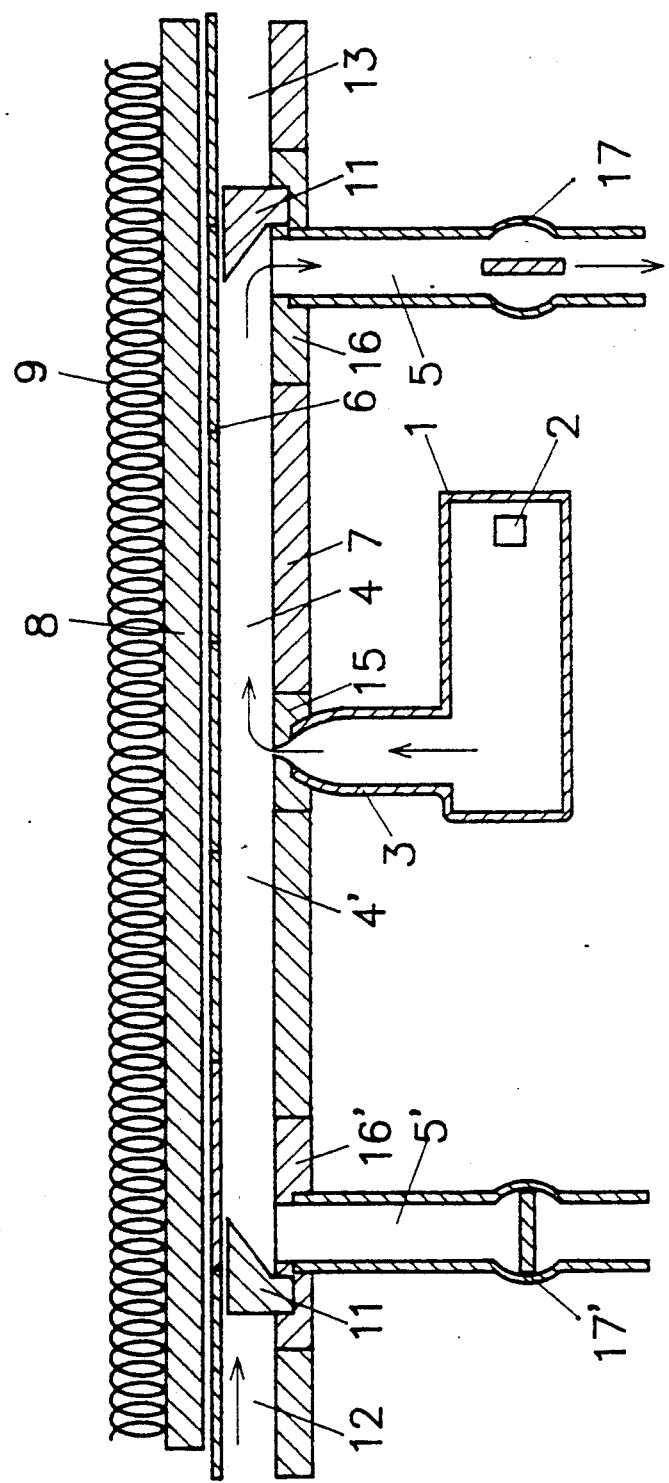
FIGS. 4 to 7 are fragmentary longitudinal sectional views of thin film forming apparatuses in second to fifth embodiments according to the present invention.

Referring to FIG. 4, a thin film forming apparatus in a second embodiment according to the present invention is provided with one nozzle 3 connected to a hearth 7 by a connecting member 15, and two exhaust ducts 5 and 5' connected to the hearth 7 by connection members 16 and 16' at positions respectively on the opposite sides of the nozzle 3. Valves 17 and 17' are provided respectively in the exhaust ducts 5 and 5' to open or close the exhaust ducts 5 and 5'. When the valve 17' is closed to exhaust the mist through the exhaust duct 5, the mist spouted through the nozzle 3 flows through a right-hand film forming chamber 4 in a direction indicated by arrows. When the valve 17 is closed to exhaust the mist through the exhaust duct 5', the mist flows through a left-hand film forming chamber 4' in the reverse direction. In this case, the exhaust duct 5' may be used as an intake duct for supplying the carrier gas.

Figure 5:
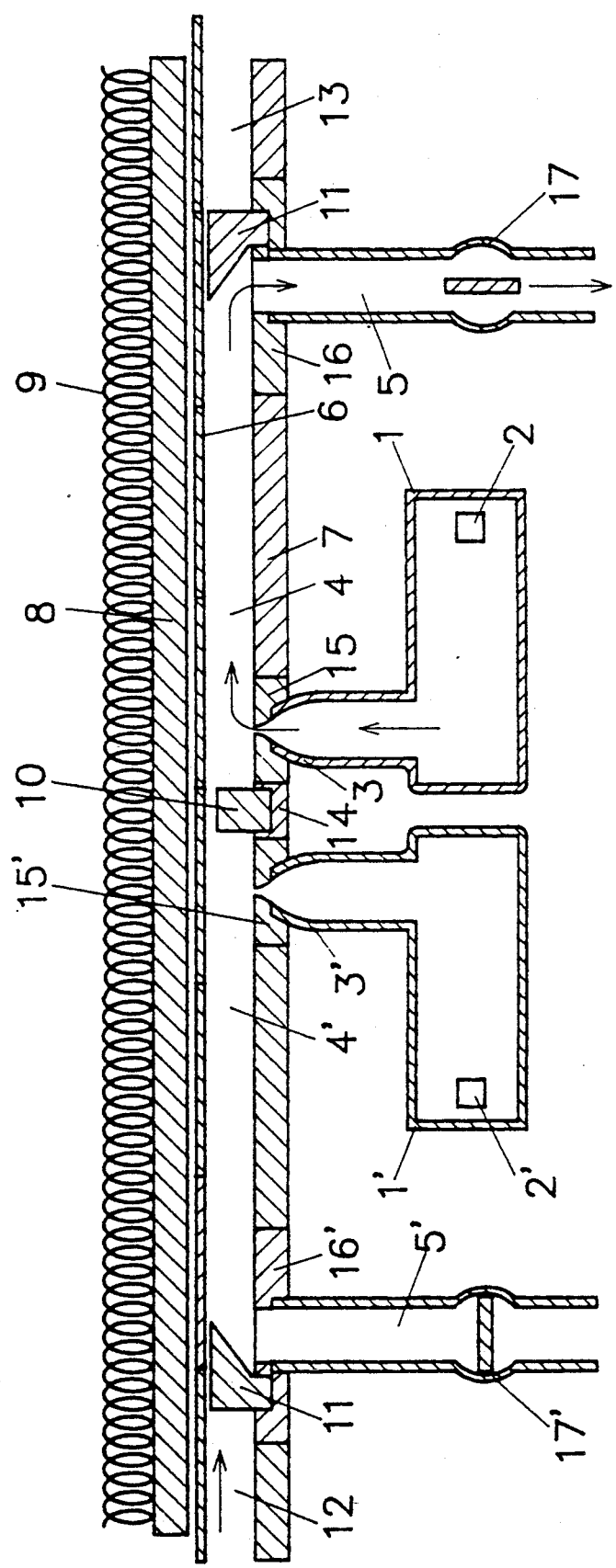

Referring to FIG. 5, a thin film forming apparatus in a third embodiment according to the present invention is provided with two nozzles 3 and 3' connected to a hearth 7 respectively by connection members 15 and 15', a partition member 10 mounted on a connection member 14 and disposed between the nozzles 3 and 3', and two exhaust ducts 5 and 5' disposed respectively on the outside of the nozzles 3' and 3. Valves 17 and 17' are provided respectively in the exhaust ducts 5 and 5' to open or close the same. Mists spouted respectively into film forming chambers 4 and 4' flow in opposite directions. Both the film forming chambers 4 and 4', or either the film forming chamber 4 or 4' may be used.

Figure 6:
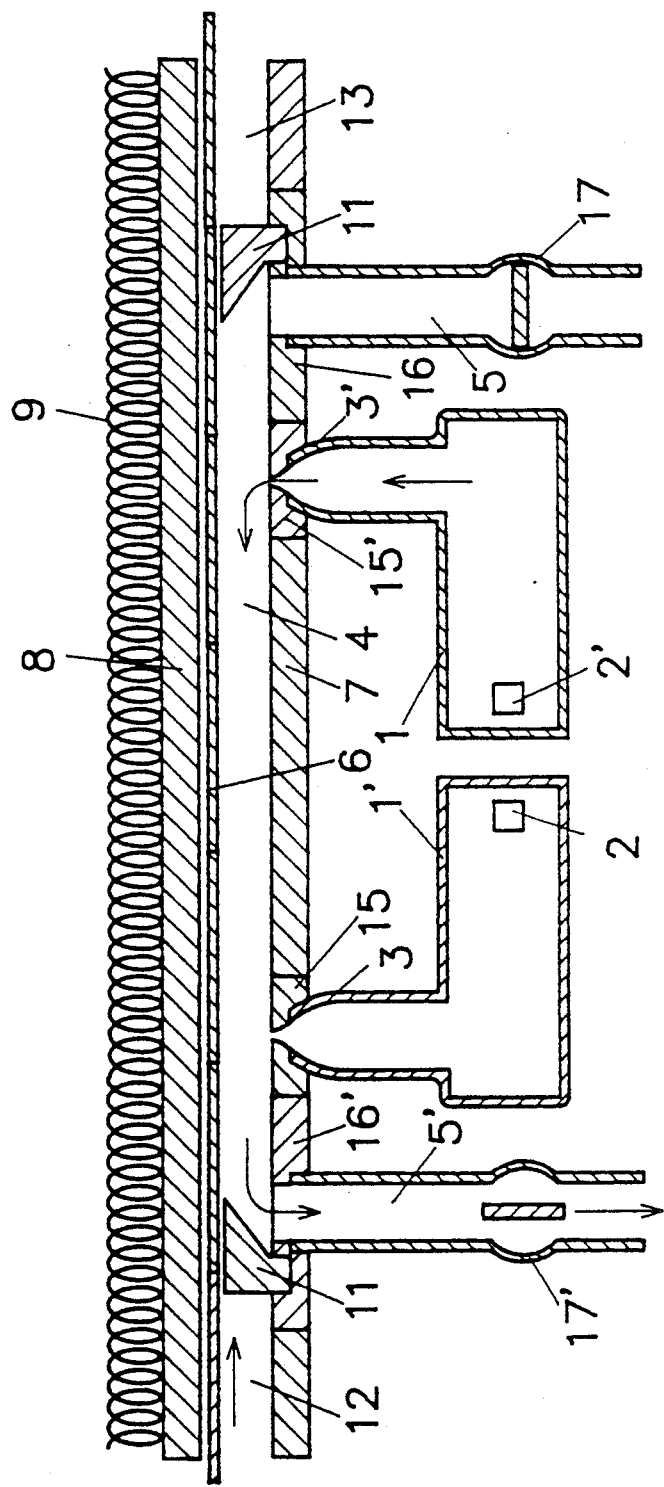

Referring to FIG. 6, a thin film forming apparatus in a fourth embodiment according to the present invention is provided with two nozzles 3 and 3' connected to a hearth 7 by connection members 15 and 15' respectively at positions near exhaust ducts 5' and 5 provided respectively with valves 17' and 17. The mist of the source solution is spouted through the nozzle 3' while the valve 17 is closed to make the mist flow through a film forming chamber 4 in a direction indicated by the arrows and is exhausted through the exhaust duct 5'. The mist is spouted through the nozzle 3 while the valve 17' is closed to make the mist flow through the film forming chamber 4 in the reverse direction.

Figure 7:
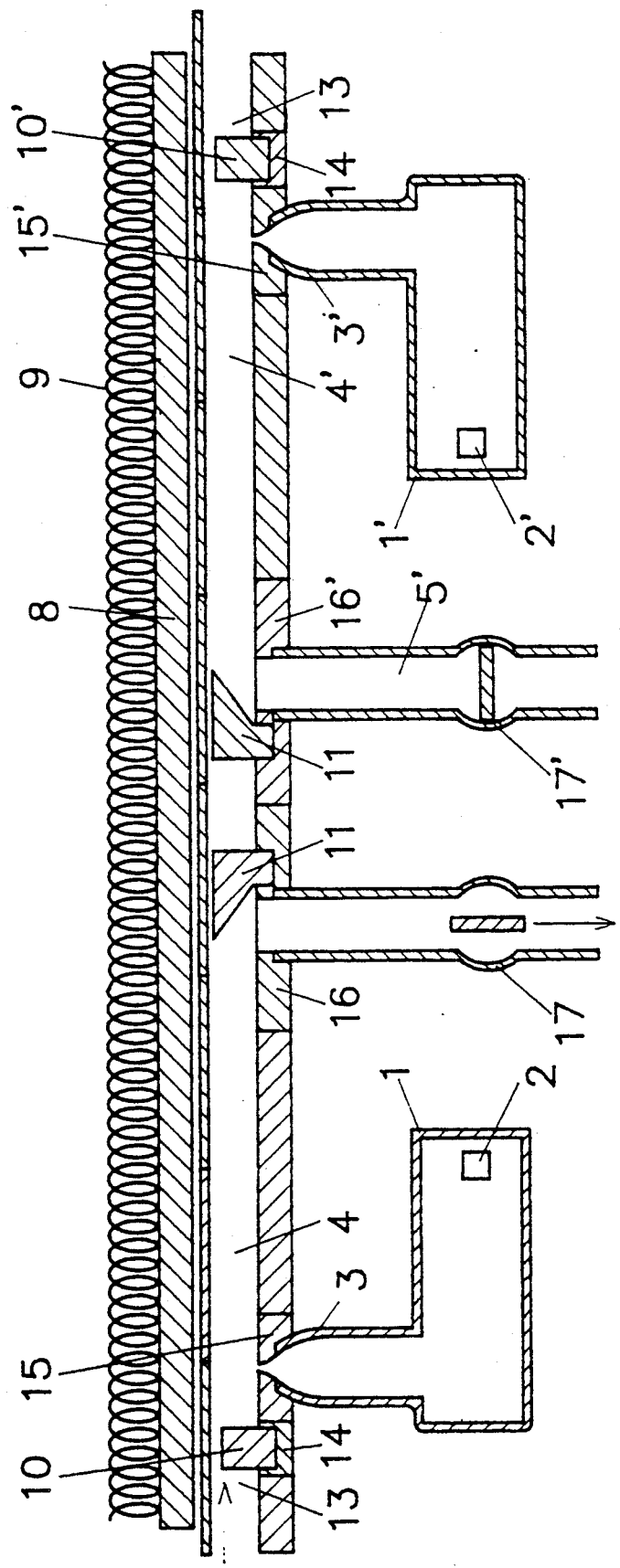

Referring to FIG. 7, a thin film forming apparatus in a fifth embodiment according to the present invention is provided with two exhaust ducts 5 and 5' connected to a hearth 7 by connection members 16 and 16', partition members 10 connected to the hearth 7 by connection members 14, mist guides 11 disposed between the exhaust ducts 5 and 5', and two nozzles 3 and 3' connected to the hearth 7 by connection members 15 and 15' respectively on the outside of the exhaust ducts 5 and 5'.

Valves 17 and 17' are provided respectively in the exhaust ducts 5 and 5' to open or close the same.

The mists spouted in film forming chambers 4 and 4' flow through the film forming chambers 4 and 4' in opposite directions. Both the film forming chambers 4 and 4' or either of film forming chamber 4 or 4' may be used. The mist guides 11 and the nozzle 3' may be omitted when only film forming chamber 4' is used.

The thin film forming apparatus shown in FIGS. 4 to 7 employ connection members 14, 15, 15', 16 and 16' to connect removably the nozzles 3 and 3' and the exhaust ducts 5 and 5' to change the arrangement of the nozzles 3 and 3' and the exhaust ducts 5 and 5'. However, the means for changing the respective positions of the nozzles 3 and 3' and the exhaust ducts 5 and 5' are not necessarily essential, because the flowing direction of the mist in the film forming chambers 4 and 4' can be changed by properly operating the exhaust ducts 5 and 5'.

As is apparent from the foregoing description, according to the present invention, the relationship between the direction of flow of the mist in the film forming chamber and the substrate conveying direction can be changed to form thin films of various laminate constructions and different characteristics meeting diversified purposes. A thin film forming apparatus provided with a plurality of nozzles is able to form a thin film of a comparatively large thickness without reducing the productivity of the thin film forming apparatus.

What is claimed is:

1. A thin film forming apparatus for forming a thin film on a surface of a plurality of substrates, said apparatus comprising:
    an atomizer for atomizing a source solution;
    a film forming chamber provided above said atomizer, said film forming chamber having a first end and a second end;
    a nozzle provided on an upper portion of said atomizer, said nozzle being connected to and opening into said first end of said film forming chamber so as to be able to introduce atomized source solution therein;
    an exhaust duct connected to said second end of said film forming chamber for removing said atomized source solution therefrom;
    substrate feeding means for feeding said substrates in said film forming chamber in a first direction and reversing the direction of feed of said substrates so that the substrates travel in the film forming chamber in a second direction opposite to said first direction, said surface of said substrates forming the ceiling in the film forming chamber; and
    heating means for heating the substrates.

2. A thin film forming apparatus for forming a thin film on a surface of a plurality of substrates, said apparatus comprising:
    an atomizer for atomizing a source solution;
    a film forming chamber provided above said atomizer, said film forming chamber having a first end, a second end and a bottom wall provided with a plurality of openings therein;
    removable connection members provided in and in sealing relationship with said plurality of openings in said bottom wall of said film forming chamber;
    a nozzle provided on an upper portion of said atomizer, said nozzle being connected to an opening into said first end of said film forming chamber through one of said removable connection members so as to be able to introduce atomized source solution therein;
    an exhaust duct connected to said second end of said film forming chamber through another of said removable connection members so as to be able to remove atomized source liquid therefrom, said one and another removable connection members being interchangeable with each other;
    substrate feeding means for feeding said substrates into said film forming chamber in such a manner that said surface of said substrates form the ceiling of said film forming chamber; and
    heating means for heating the substrates.

3. A thin film forming apparatus for forming a thin film on a surface of a plurality of substrates said apparatus comprising:
    at least one atomizer for atomizing a source solution;
    a film forming chamber provided above said at least one atomizer;
    a nozzle provided on an upper portion of each said at least one atomizer, said nozzle(s) being connected to and opening into said film forming chamber so as to be able to introduce atomized source solution therein;
    intake and exhaust ducts connected to the film forming chamber respectively at positions on opposite sides of said nozzle(s), said intake and exhaust ducts having flow regulating means provided therein;
    substrate feeding means for feeding said substrates into said film forming chamber in such a manner that said surface of said substrates form the ceiling of said film forming chamber; and
    heating means for heating the substrate.

4. A thin film forming apparatus for forming a thin film on a surface of a plurality of substrates, said apparatus comprising:
    a plurality of atomizers for atomizing a source solution;
    a film forming chamber provided above said plurality of atomizers;
    a nozzle provided on an upper portion of each of said atomizers, each of said nozzles being disposed adjacent to one another and connected to and opening into said film forming chamber so as to be able to introduce atomized source solution therein;
    exhaust duct means connected to said film forming chamber for removing atomized source solution therefrom;
    substrate feeding means for feeding said substrates into said film forming chamber in such a manner that said surface of said substrates form the ceiling of said film forming chamber; and
    heating means for heating the substrate.

5. A thin film forming apparatus for forming a thin film on a surface of a plurality of substrates, said apparatus comprising:
    a pair of atomizes for atomizing a source solution;
    a film forming chamber provided above said pair of atomizers;
    a nozzle provided on an upper portion of each of said pair of atomizers, said nozzles being connected to and opening into said film forming chamber so as to be able to introduce atomized source solution therein;
    an exhaust duct connected to the film forming chamber at a position between the openings of said nozzles so as to be able to remove atomized source solution from said film forming chamber;
    substrate feeding means for feeding said substrates into said film forming chamber in such a manner that said surface of said substrates form the ceiling of said film forming chamber; and
    heating means for heating the substrate.

* * * * *

UNITED STATES PATENT AND TRADEMARK OFFICE
CERTIFICATE OF CORRECTION

PATENT NO. : 5 069 157
DATED      : December 3, 1991
INVENTOR(S): Mizuho IMAI et al It is certified that error appears in the above-identified patent and that said Letters Patent is hereby corrected as shown below:

Column 5, line 64; change "an opening" to ---and opening---.

Column 6, line 12; change "substrates" to ---substrates,---.

Column 6, line 52; change "atomizes" to ---atomizers---.

Signed and Sealed this

Fifteenth Day of June, 1993

Attest:

MICHAEL K. KIRK

Attesting Officer

Acting Commissioner of Patents and Trademarks